(12) United States Patent
Yuze et al.

(10) Patent No.: US 10,529,532 B2
(45) Date of Patent: Jan. 7, 2020

(54) ION SOURCE AND ION IMPLANTATION APPARATUS

(71) Applicant: ULVAC, INC., Chigasaki-shi, Kanagawa (JP)

(72) Inventors: Takumi Yuze, Chigasaki (JP); Toshihiro Terasawa, Chigasaki (JP); Naruyasu Sasaki, Chigasaki (JP)

(73) Assignee: ULVAC, INC., Chigasaki (JP)

( * ) Notice: Subject to any disclaimer, the term of this patent is extended or adjusted under 35 U.S.C. 154(b) by 0 days.

(21) Appl. No.: 16/381,512

(22) Filed: Apr. 11, 2019

(65) Prior Publication Data

US 2019/0237290 A1    Aug. 1, 2019

Related U.S. Application Data

(63) Continuation of application No. PCT/JP2017/046987, filed on Dec. 27, 2017.

(30) Foreign Application Priority Data

Apr. 6, 2017  (JP) .................................. 2017-075838

(51) Int. Cl.
*H01J 37/08*    (2006.01)
*H01J 27/08*    (2006.01)
(Continued)

(52) U.S. Cl.
CPC .............. *H01J 37/08* (2013.01); *H01J 27/02* (2013.01); *H01J 37/3002* (2013.01); (Continued)

(58) Field of Classification Search
CPC ........ H01J 37/08; H01J 27/08; H01J 37/3171; H01J 2237/31701; H01J 49/10; (Continued)

(56) References Cited

U.S. PATENT DOCUMENTS

| 5,107,170 A | * | 4/1992 | Ishikawa ................. | H01J 27/18 |
| | | | | 313/231.31 |
| 5,306,921 A | * | 4/1994 | Tanaka .................... | H01J 37/08 |
| | | | | 250/492.21 |

(Continued)

FOREIGN PATENT DOCUMENTS

| JP | 2011-124059 A | 6/2011 |
| JP | 2014-3046 A | 1/2014 |
| JP | 2015-95414 A | 5/2015 |

OTHER PUBLICATIONS

Apr. 3, 2018 International Search Report issued in International Patent Application No. PCT/JP2017/046987.
(Continued)

*Primary Examiner* — David A Vanore
(74) *Attorney, Agent, or Firm* — Oliff PLC

(57) ABSTRACT

An ion source having an ion generation container configured to generate ions by reacting ionized gas introduced into the container via a tubular gas introduction pipe with an ion source material emitted in the container. The gas introduction pipe is configured to introduce the ionized gas into an inner space of the gas introduction pipe via a gas supply pipe. In the inner space of the gas introduction pipe, a detachable cooling trap member is disposed and includes a cooling trap portion configured to cool and trap a byproduct produced in the ion generation container. The cooling trap portion is disposed near a supply-side leading end of the gas supply pipe in the inner space of the gas introduction pipe and is not contact with an interior wall face of the gas introduction pipe.

8 Claims, 6 Drawing Sheets

(51) Int. Cl.
- *H01J 49/10* (2006.01)
- *H01J 37/30* (2006.01)
- *H01J 37/317* (2006.01)
- *H01J 27/02* (2006.01)
- *H01L 21/265* (2006.01)

(52) U.S. Cl.
CPC ........ *H01J 37/317* (2013.01); *H01J 37/3171* (2013.01); *H01L 21/265* (2013.01)

(58) Field of Classification Search
CPC ........... H01J 2237/006; H01J 2237/061; H01J 2237/08; H01J 2237/0807; H01J 27/26; H01J 37/28; H01J 49/0031; C23C 14/48; H01L 21/26566; H01L 21/2658
USPC ............ 250/423 R, 492.21, 423 F, 424, 426, 250/492.3, 492.1
See application file for complete search history.

(56) References Cited

U.S. PATENT DOCUMENTS

| | | | | |
|---|---|---|---|---|
| 5,675,606 A * | 10/1997 | Brainard | ......... | H01J 27/14 315/111.71 |
| 5,894,131 A * | 4/1999 | Fukunaga | ......... | C23C 14/48 250/492.21 |
| 7,064,491 B2 * | 6/2006 | Horsky | ......... | H01J 27/205 315/111.81 |
| 7,312,579 B2 * | 12/2007 | Zhurin | ......... | H01J 27/146 250/423 R |
| 7,476,868 B2 * | 1/2009 | Kim | ......... | H01J 27/024 250/423 R |
| 7,550,719 B2 * | 6/2009 | Kawana | ......... | H01J 49/10 250/281 |
| 7,652,264 B2 * | 1/2010 | Kwon | ......... | H01J 27/08 250/423 F |
| 7,812,321 B2 * | 10/2010 | Kurunczi | ......... | H01J 27/08 250/423 F |
| 8,253,114 B2 * | 8/2012 | Yamashita | ......... | H01J 27/14 250/423 R |
| 8,324,592 B2 * | 12/2012 | Ryding | ......... | H01J 27/04 250/423 R |
| 8,834,685 B2 * | 9/2014 | Morimoto | ......... | C23C 14/046 204/192.12 |
| 9,929,526 B2 * | 3/2018 | Saitou | ......... | C23C 14/3407 |
| 2004/0261701 A1 * | 12/2004 | Kobayashi | ......... | B05C 5/0216 118/696 |
| 2011/0139613 A1 * | 6/2011 | Ikejiri | ......... | H01J 27/022 204/298.12 |
| 2014/0145073 A1 * | 5/2014 | Johnson | ......... | G01N 21/31 250/282 |
| 2015/0129775 A1 * | 5/2015 | Sato | ......... | H01J 27/08 250/424 |
| 2017/0229277 A1 * | 8/2017 | Matsubara | ......... | H01J 27/26 |

OTHER PUBLICATIONS

Apr. 3, 2018 Written Opinion issued in International Patent Application No. PCT/JP2017/046987.

Oct. 8, 2019 International Preliminary Report on Patentability issued in International Patent Application No. PCT/JP2017/046987.

* cited by examiner

ION SOURCE AND ION IMPLANTATION APPARATUS

INCORPORATION BY REFERENCE

This application is a Continuation of PCT/JP2017/046987 filed Dec. 27, 2017, and is based on and claims benefit of priority from earlier Japanese Patent Application No. 2017-075838 filed on Apr. 6, 2017, the descriptions of which are incorporated herein by reference.

TECHNICAL FIELD

The present invention relates to an ion source, and particularly to an ion implantation apparatus, including an ion source, for implanting ions into a substrate.

BACKGROUND

In recent years, a relatively inexpensive method of manufacturing a silicon carbide (SiC) substrate with excellent heat resistance and withstand voltage in comparison to existing silicon (Si) substrate has been established.

Processes using the SiC substrate include implanting aluminum ions as a dopant, in which an ion implantation apparatus having an ion source that generates an aluminum ion beam is used.

With such an ion source, methods of generating aluminum ions include reacting aluminum nitride or alumina, which is disposed in a container, with a fluorine-based gas (for example, $PF_3$) introduced into the container.

However, during the reaction of aluminum nitride with $PF_3$, there is an disadvantage that aluminum fluoride ($AlF_x$) is produced as a byproduct. The aluminum fluoride adheres to a low-temperature face of an inner space of a gas introduction pipe. Specifically, the aluminum fluoride adheres to the supply-side leading end and the interior wall face of a gas supply pipe, clogging the gas supply pipe.

Accordingly, the conventional method of generating aluminum ions has had a problem that requires frequent maintenance of the ion source.

SUMMARY

The present embodiment remedies the above-mentioned problem by reducing, as much as possible, the amount of byproduct that adheres to the supply-side leading end and the interior wall face of the gas supply pipe during the generation of ions by reacting ionized gas with an ion source material in an ion generation container of an ion source.

An ion source for generating an ion beam according to one embodiment includes: an ion generation container configured to generate ions by reacting ionized gas that has been introduced into the ion generation container via a tubular gas introduction pipe with an ion source material emitted in the ion generation container. The gas introduction pipe is configured to introduce the ionized gas into an inner space of the gas introduction pipe via a gas supply pipe. A detachable cooling trap member is provided in the inner space of the gas introduction pipe and has a cooling trap portion that cools and traps a byproduct produced in the ion generation container. The cooling trap portion is disposed near a supply-side leading end of the gas supply pipe in the inner space of the gas introduction pipe, and is not in contact with an interior wall face of the gas introduction pipe.

In an embodiment, the cooling trap portion of the cooling trap member has a portion disposed on an ion generation container side with respect to the supply-side leading end of the gas supply pipe in the inner space of the gas introduction pipe.

In an embodiment, the cooling trap portion of the cooling trap member is disposed on a side of direction away from the ion generation container with respect to the supply-side leading end of the gas supply pipe in the inner space of the gas introduction pipe.

In an embodiment, the cooling trap member is detachably fixed by a screw at an end on a far side of the gas introduction pipe with respect to the ion generation container.

In an embodiment, the cooling trap portion of the cooling trap member has a planar trap face disposed at a top of a rod-shaped portion.

In an embodiment, the cooling trap portion of the cooling trap member has a groove-shaped retraction portion in a middle portion of a rod-shaped portion. The supply-side leading end of the gas supply pipe projects into the inner space of the gas introduction pipe and is disposed inside the groove of the retraction portion. The supply-side leading end is hidden behind a side portion on the ion generation container side of the groove.

In an embodiment, the ionized gas is fluorine-based gas and each ion is an aluminum ion obtained from aluminum nitride.

An ion implantation apparatus for implanting ions into a substrate with irradiation of an ion beam according to any one of the above-mentioned embodiments, has an ion source and implants the ions into the substrate with the irradiation of the ion beam emitted from the ion source.

According to an embodiment, a cooling trap member is provided in an inner space of a gas introduction pipe into which ionized gas is introduced via a gas supply pipe. The cooling trap member has a cooling trap portion that cools and traps byproduct produced in an ion generation container. Consequently, in generation of ions by reacting the ionized gas with an ion source material in the ion generation container of an ion source, the amount of the gaseous byproduct to adhere in a solid state to the supply-side leading end of the gas supply pipe of the gas introduction pipe and the interior wall face thereof is reduced as much as possible. Thus, clogging of a gas introduction port of the gas introduction pipe can be prevented and a stable ion beam current can be obtained.

As a result, the maintenance cycle of the ion source can be extended compared to conventional techniques.

In addition, if the cooling trap member is configured to be detachably mounted to the gas introduction pipe by a screw, manual maintenance work can be easily performed.

DETAILED DESCRIPTION OF EMBODIMENTS

Hereinafter, an embodiment of the present invention will be described with reference to the drawings.

Figure 1:
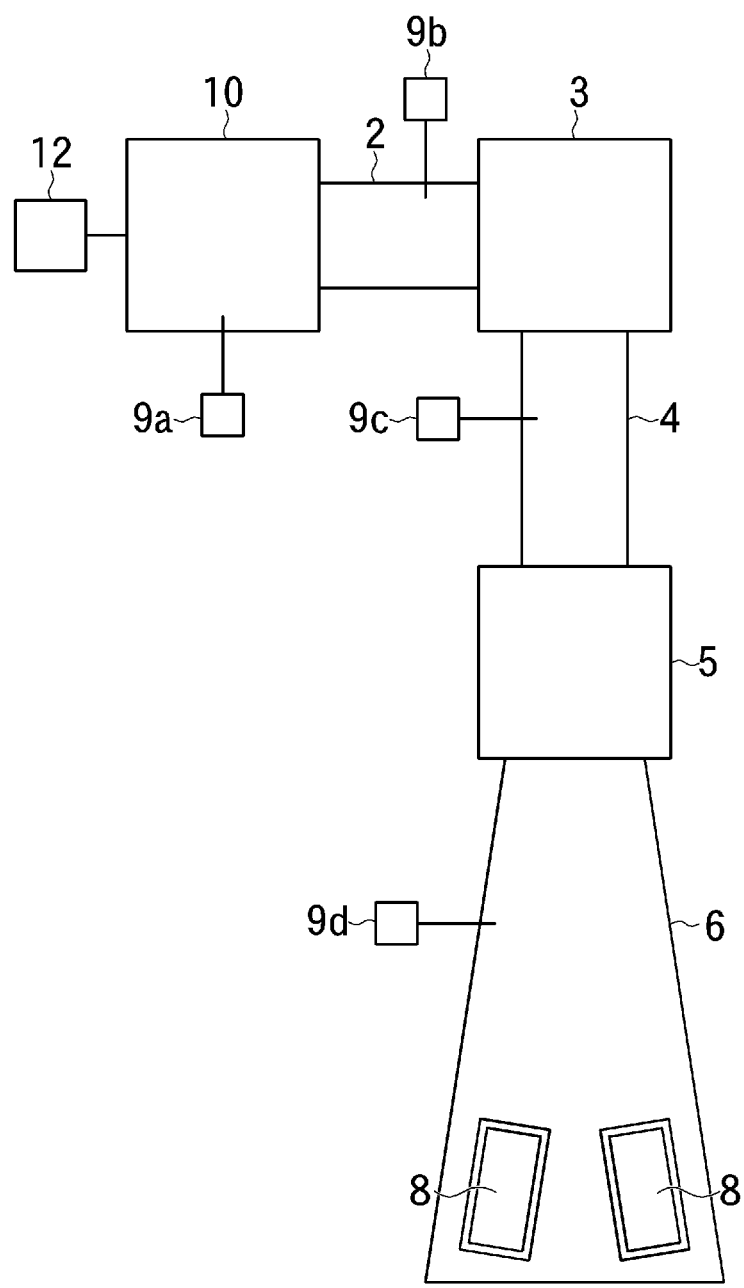
FIG. 1 is a schematic configuration diagram illustrating an entire ion implantation apparatus using an ion source in accordance with an embodiment.

FIG. 1 is a schematic configuration diagram illustrating an entire ion implantation apparatus using an ion source.

As illustrated in FIG. 1, an ion implantation apparatus 1 of the present example includes an ion source 10, a travel chamber 2, a mass spectrometer 3, an accelerator 4, a scanning device 5, and an implantation chamber 6, to be described later, connected in this order.

In the ion implantation apparatus 1, the ion source 10, the travel chamber 2, the accelerator 4, and the implantation chamber 6 are evacuated by evacuation devices 9a, 9b, 9c, and 9d, respectively.

A gas supply unit 12 is connected to the ion source 10 and gas supplied from the gas supply unit 12 is ionized. The generated ions travel inside the travel chamber 2 as an ion beam to be made incident on the inside of the mass spectrometer 3.

Inside the mass spectrometer 3, the ions in the ion beam are subjected to mass analysis, and ions having a desired charge mass ratio are caused to pass through to be injected into the accelerator 4 as an ion beam.

In the accelerator 4, positive ions in the ion beam are accelerated to be injected into the scanning device 5, and the scanning device 5 causes the ion beam to be injected into the implantation chamber 6 while controlling the travel direction of the ion beam.

A plurality of (in this case, two) substrates 8 is disposed inside the implantation chamber 6. The ion beam is oriented in any direction of the plurality of substrates 8 by the above-described scanning device 5. The substrates 8 are irradiated with the ions while scanning the surfaces of the substrates 8 one by one, so that the ions are implanted inside the substrates 8.

Figure 2:
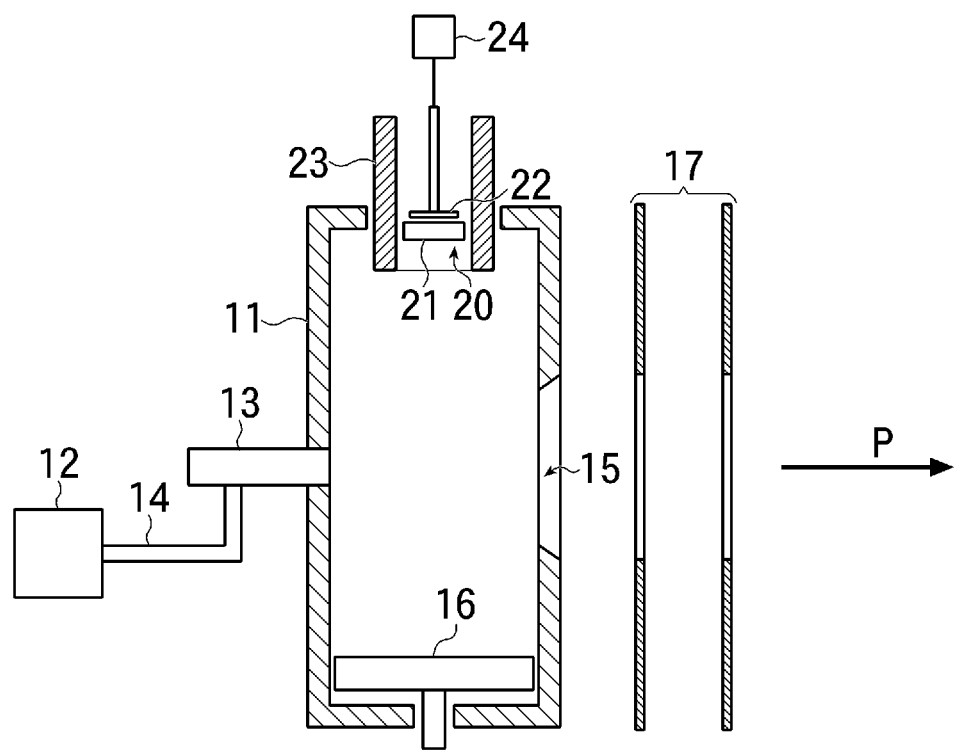
FIG. 2 is a cross-sectional view illustrating a configuration example of the ion source according to an embodiment.

FIG. 2 is a cross-sectional view illustrating a configuration example of the ion source according to an embodiment.

As illustrated in FIG. 2, the ion source 10 of the present example is disposed in the above-described ion implantation apparatus 1 (see FIG. 1), and has an ion generation container 11 that generates ions.

The ion generation container 11 may be made of a metallic material, and formed in a rectangular parallelepiped box shape, for example.

The ion generation container 11 of the present embodiment is disposed with the longitudinal direction oriented in a direction orthogonal to the ion emission (travel) direction P.

The gas supply unit 12 for supplying ionized gas, which is composed of, for example, phosphorus trifluoride ($PF_3$), is provided on the upstream side in the ion emission direction P of the ion generation container 11.

The gas supply unit 12 is provided on the upstream side in the ion emission direction P of the ion generation container 11. The gas supply unit 12 is coupled, via a gas supply pipe 14, to a gas introduction port 13a (see FIG. 3) of a gas introduction pipe 13 that introduces the ionized gas into the ion generation container 11.

On the other hand, a slit 15 for emitting ions from the inside of the ion generation container 11 is provided on the downstream side in the ion emission direction P of the ion generation container 11.

In the ion generation container 11, a thermionic emitting portion 20 that emits thermoelectrons due to heating of a hot cathode is provided on one wall in the direction orthogonal to the ion emission direction P. A counter reflecting electrode (repeller) 16 is provided, facing the thermionic emitting portion 20, on the other wall in the direction orthogonal to the ion emission direction P, so as to have a negative potential.

The thermionic emitting portion 20 includes the hot cathode having: a cathode portion 21 with, for example, a bottomed cylindrical shape; and a filament 22 provided on the rear face side inside the cathode portion 21 and connected to a power source 24. Here, the cathode portion 21 is made of, for example, tungsten (W).

In addition, an ion source material member 23 is provided on the periphery of the cathode portion 21.

The ion source material member 23 is made of aluminum nitride (AlN) and surrounds the periphery of the cathode portion 21 so as to be heated by the cathode portion 21.

In such a configuration, when fluorine-based gas ($PF_3$) is introduced into the ion generation container 11 from the gas supply pipe 14 via the gas introduction port 13a and an inner space 13b (see FIG. 3) of the gas introduction pipe 13 to generate plasma in the container, aluminum nitride reacts with fluorine-based gas to produce aluminum (Al) ions, and aluminum fluoride ($AlF_x$) is produced in a gaseous state as a byproduct in the reaction process.

In this case, in order to cause the above reaction, it is necessary that the cathode portion 21 be heated due to heating of the filament 22 that is the hot cathode and furthermore, the ion source material member 23 reach a predetermined temperature due to heating of the cathode portion 21.

An extraction electrode 17 is provided on the downstream side in the ion emission direction P of the slit 15 outside the ion generation container 11. The extraction electrode 17 is configured to extract the ions generated in the ion generation container 11 to generate an ion beam.

Figure 3:
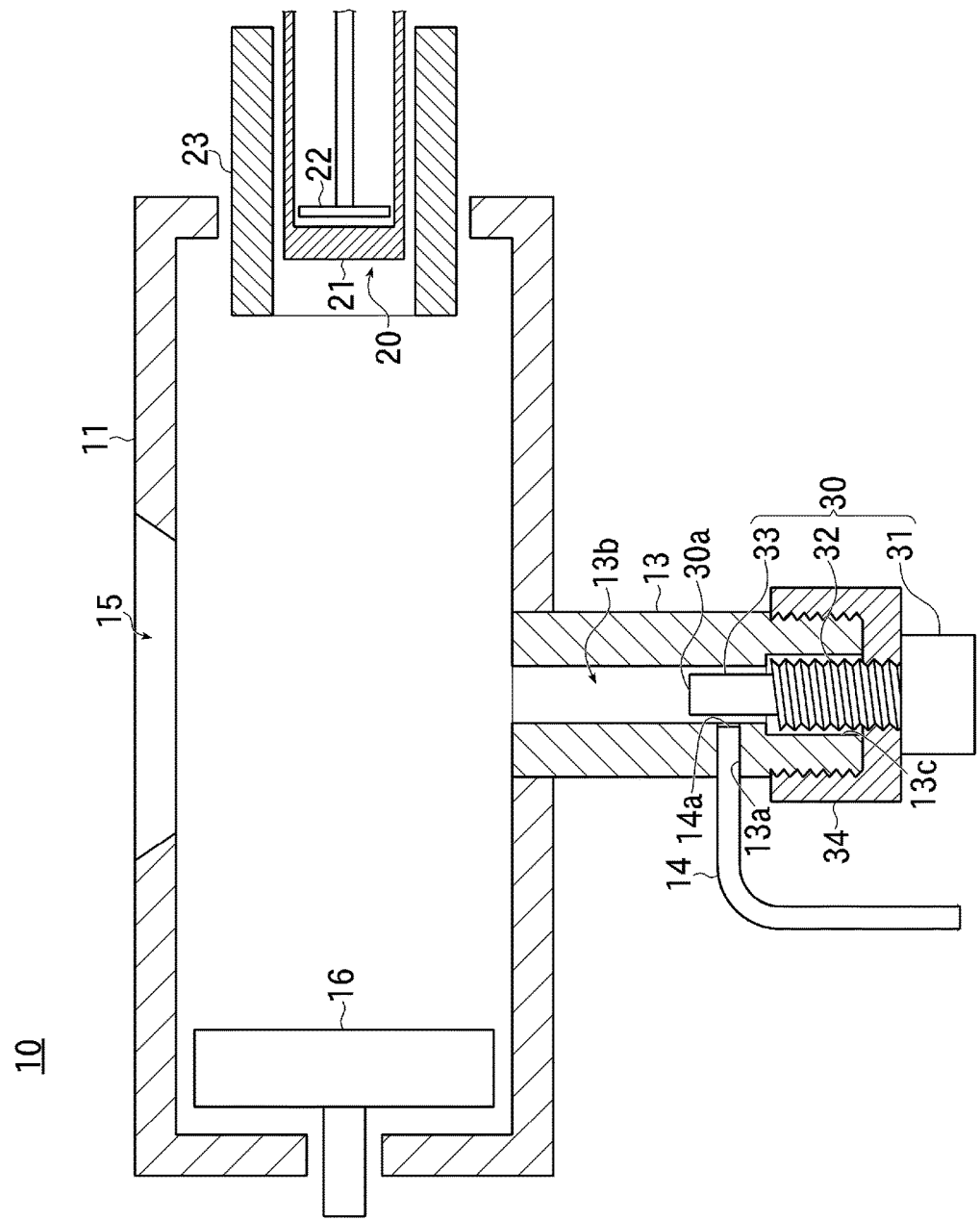
FIG. 3 is a cross-sectional view illustrating a main part of the present embodiment.
Figure 4:
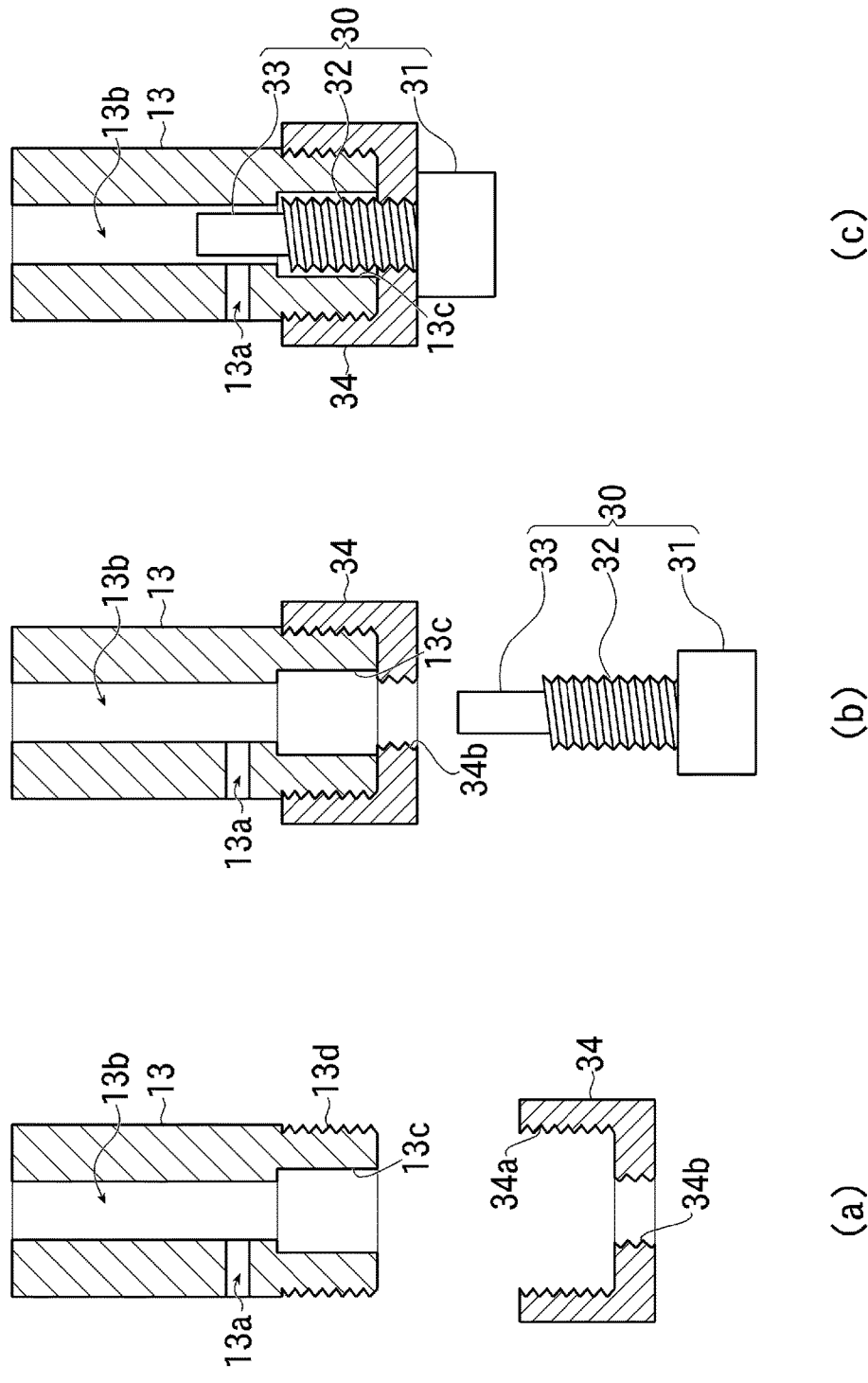
FIGS. 4(a) to 4(c) are process diagrams illustrating a method of mounting a cooling trap member to a gas introduction pipe in the same embodiment.

FIG. 3 is a cross-sectional view illustrating a main part of the present embodiment, and FIGS. 4(a) to 4(c) are process diagrams illustrating a method of mounting a cooling trap member to the gas introduction pipe in the same embodiment.

As illustrated in FIG. 3, together with an attachment member 34, a cooling trap member 30 of the present embodiment is mounted to the end on the far side of the gas introduction pipe 13 with respect to the ion generation container 11. The gas introduction pipe 13 is made of, for example, molybdenum (Mo).

The cooling trap member 30 is made of a metal such as stainless steel, and is integrally formed.

The cooling trap member 30 includes: a knob 31 having, for example, a cylindrical shape; a threaded portion 32 including a male screw; and a cooling trap portion 33 having, for example, a cylindrical shape, provided concentrically.

Here, the threaded portion 32 of the cooling trap member 30 is formed to be housed in a noncontact state in a housing portion 13c provided at the end on the far side in an interior-wall portion of the tubular (for example, cylindrical) gas introduction pipe 13 with respect to the ion generation container 11. The housing portion 13c has an inner diameter larger than the diameter of the threaded portion 32.

In addition, the cooling trap portion 33 of the cooling trap member 30 has a size set such that the outer diameter of the cooling trap portion 33 is smaller than the inner diameter of the gas introduction pipe 13, and the cooling trap portion 33 is not in contact with the interior wall face of the gas introduction pipe 13.

In a case where the cooling trap member 30 is mounted to the gas introduction pipe 13, the cooling trap portion 33 preferably has a portion disposed on the ion generation container 11 side with respect to the gas introduction port 13a, in the inner space 13b of the gas introduction pipe 13.

The cooling trap portion 33 of the cooling trap member 30 has a function of physically trapping (exhausting) aluminum fluoride, and as a result, the abundance ratio (partial pressure) of gaseous aluminum fluoride near a supply-side leading end 14a of the gas supply pipe 14 provided in the gas introduction port 13a is decreased. This serves to prevent aluminum fluoride from adhering to the supply-side leading end 14a of the gas supply pipe 14 as well as the interior wall face of the gas supply pipe 14.

The fitting relationship between the gas introduction port 13a, which is a hole provided in a side portion of the gas introduction pipe 13, and the gas supply pipe 14 inserted into the gas introduction port 13a is, for example, a clearance fit indicated in JIS B 0401-1, thereby maintaining the airtightness of the inner space 13b of the gas introduction pipe 13.

Although this structure has an effect of simplifying the apparatus configuration, the thermal resistance between the gas introduction pipe 13 and the gas supply pipe 14 is increased. That is, since the gas supply pipe 14 has an large area exposed to the atmosphere at room temperature due to the apparatus configuration, the influence of the room temperature around the apparatus is dominant over the temperature of the supply-side leading end 14a of the gas supply pipe 14. In addition, the influence of the temperature of the ion generation container 11 is dominant over the temperature of the gas introduction port 13a.

Therefore, considering only the influence of temperature, the aluminum fluoride flowing into the inner space 13b of the gas introduction pipe 13 does not adhere to the interior wall face of the gas introduction port 13a. Instead, the aluminum fluoride adheres to the supply-side leading end 14a of the gas supply pipe 14 and the interior wall face of the gas supply pipe 14.

However, in the present embodiment, the size is set such that the cooling trap portion 33 of the cooling trap member 30 faces the supply-side leading end 14a of the gas supply pipe 14, and a trap face 30a at the top of the cooling trap portion 33 is positioned on the ion generation container 11 side with respect to the supply-side leading end 14a of the gas supply pipe 14.

An exhaust heat portion of the cooling trap member 30 is the knob 31 positioned on the farthest side with respect to the trap face 30a. Heat from the gas introduction pipe 13 flows to the knob 31 via a threaded portions 34a, 34b of the attachment member 34 described later and the threaded portion 32 (see FIGS. 4(a) and 4(b)), and heat in the inner space 13b flows from the cooling trap portion 33 to the knob 31 via the threaded portion 32.

The knob 31 of the cooling trap member 30 is exposed to the atmosphere at room temperature around the apparatus and the heat is released due to natural convection, so that the cooling trap portion 33 has a temperature lower than the temperature of the interior wall face of the gas introduction pipe 13. The temperature of the cooling trap portion 33 is maintained such that the aluminum fluoride can be trapped. Therefore, a positive cooling mechanism is unnecessary for the cooling trap member 30 of the present embodiment.

With such a configuration, the trap face 30a of the cooling trap portion 33 and the side face thereof positioned on the ion generation container 11 side with respect to the supply-side leading end 14a of the gas supply pipe 14 can trap the aluminum fluoride flowing into the inner space 13b of gas introduction pipe 13, whereby the abundance ratio (partial pressure) of the aluminum fluoride near the supply-side leading end 14a of the gas supply pipe 14 is decreased. As a result, a considerable reduction can be made in the progression rate of adhesion of the aluminum fluoride to the supply-side leading end 14a of the gas supply pipe 14 and the interior wall face of the gas supply pipe 14.

Note that the cooling trap member 30 of the present embodiment can be easily fabricated by processing a known bolt.

In order to mount such a cooling trap member 30 to the gas introduction pipe 13, as illustrated in FIGS. 4(a) and 4(b), the attachment member 34 is first mounted to the end on the far side of the gas introduction pipe 13 with respect to the ion generation container 11.

The attachment member 34 is made of a metal, such as stainless steel, and is integrally formed in a bottomed cylindrical shape.

The threaded portion 34a is provided on the interior wall portion of the edge of the attachment member 34. The threaded portion 34a includes a female screw formed engaging with a threaded portion 13d including a male screw provided at the end on the far side of the exterior wall portion of the gas introduction pipe 13 with respect to the ion generation container 11.

In addition, a threaded portion 34b is provided at the bottom of the center of the attachment member 34. The threaded portion 34b includes a female screw engaging with the threaded portion 32 of the cooling trap member 30.

Thereafter, the cooling trap portion 33 of the cooling trap member 30 is inserted into the inner space 13b from the end on the far side of the gas introduction pipe 13 with respect to the ion generation container 11. The threaded portion 32 of the cooling trap member 30 engages with the threaded portion 34b of the attachment member 34 to mount and fit the cooling trap member 30 to the gas introduction pipe 13 (see FIGS. 4(b) and 4(c)).

In the present embodiment, when the ion source material member 23 is heated to emit aluminum nitride, and fluorine-based gas is introduced into the ion generation container 11 from the gas supply pipe 14 to be treated with plasma. The aluminum nitride reacts with the fluorine-based gas to generate aluminum atoms, and aluminum ions are produced by electron collision.

In addition, in the reaction process, aluminum fluoride ($AlF_x$) is produced in a gaseous state as a byproduct.

In the ionization, the temperature of the thermionic emitting portion 20 in the ion generation container 11 becomes 2000° C. or higher, and the temperature of the gas introduction pipe 13 in which the influence of the temperature inside the ion generation container 11 is dominant rises to about 600° C. As such, the aluminum fluoride does not adhere to the interior wall face or the gas introduction port 13a of the gas introduction pipe 13.

On the other hand, the temperature of the supply-side leading end 14a of the gas supply pipe 14 disposed in the gas introduction port 13a of the gas introduction pipe 13 is lower than that of the interior wall face of the gas introduction pipe 13, since the influence of the room temperature around the apparatus is dominant.

In addition, the cooling trap portion 33 of the cooling trap member 30 has a temperature lower than the temperature of the interior wall face of the gas introduction pipe 13, and is maintained at a temperature at which the aluminum fluoride can be trapped.

However, as illustrated in FIG. 3, the cooling trap portion 33 of the cooling trap member 30 faces the supply-side leading end 14a of the gas supply pipe 14, and the trap face 30a at the top of the cooling trap portion 33 is positioned on the ion generation container 11 side with respect to the supply-side leading end 14a of the gas supply pipe 14. Therefore, the aluminum fluoride flowing into the inner space 13b of the gas introduction pipe 13 is trapped on the trap face 30a of the cooling trap portion 33 and the side face thereof, whereby the abundance ratio (partial pressure) of the aluminum fluoride near the supply-side leading end 14a of the gas supply pipe 14 decreases. As a result, a considerable reduction can be made in the progression rate of adhesion of the aluminum fluoride to the supply-side leading end 14a of the gas supply pipe 14 and the interior wall face of the gas supply pipe 14.

Furthermore, it is possible to prevent the gas supply pipe 14 from being clogged due to adhesion of the aluminum fluoride produced as a byproduct in the ion generation container 11 of the ion source 10, in generation of aluminum ions, so that a stable ion beam current can be obtained. As a result, the maintenance cycle of the ion source 10 can be extended in comparison to the conventional technique.

Note that, with further detailed description, the effect of an embodiment can be regarded as the following.

If the preferential adhesion of the aluminum fluoride flowing into the inner space 13b of the gas introduction pipe 13 to the supply-side leading end 14a of the gas supply pipe 14 and the interior wall face of the gas supply pipe 14 is due to the temperature of the gas supply pipe 14 being lower than that of the interior wall face of the gas introduction pipe 13 as the influence of the room temperature around the apparatus is dominant, it is also possible to avoid adhesion of the aluminum fluoride by heating the gas supply pipe 14 itself to be maintained at a predetermined temperature or higher.

However, the ion source 10 needs high voltage for its own potential, and the gas supply pipe 14 also has the high potential. Therefore, when performance of pipe heating that is usually performed with a band heater, or the like, is attempted, it is necessary to ensure a withstand voltage of an energizing circuit of the heater for heating the gas supply pipe 14. However, such a withstand voltage cannot be ensured practically with a general-purpose product.

In addition, with regard to heating the gas supply pipe 14, since the entire pipe is difficult to heat uniformly, a decrease occurs in temperature at any part. As a result, clogging may occur in the gas supply pipe 14 due to adhesion of aluminum fluoride. In such a case, the adhered substance in the gas supply pipe 14 is considerably difficult to remove and part replacement is likely required.

However, this inconvenience can be avoided, and since the cooling trap member 30 of the present embodiment is detachably mounted and fixed to the gas introduction pipe 13 by a screw, manual maintenance work can be easily performed.

Note that the present embodiment is not limited to the description above, and various modifications can be made.

For example, the cooling trap portion 33 of the cooling trap member 30 is formed in a cylindrical shape. However, the present embodiment is not limited to a cylindrical shape and the side face of the cooling trap portion 33 can be formed being curved.

Figure 5:
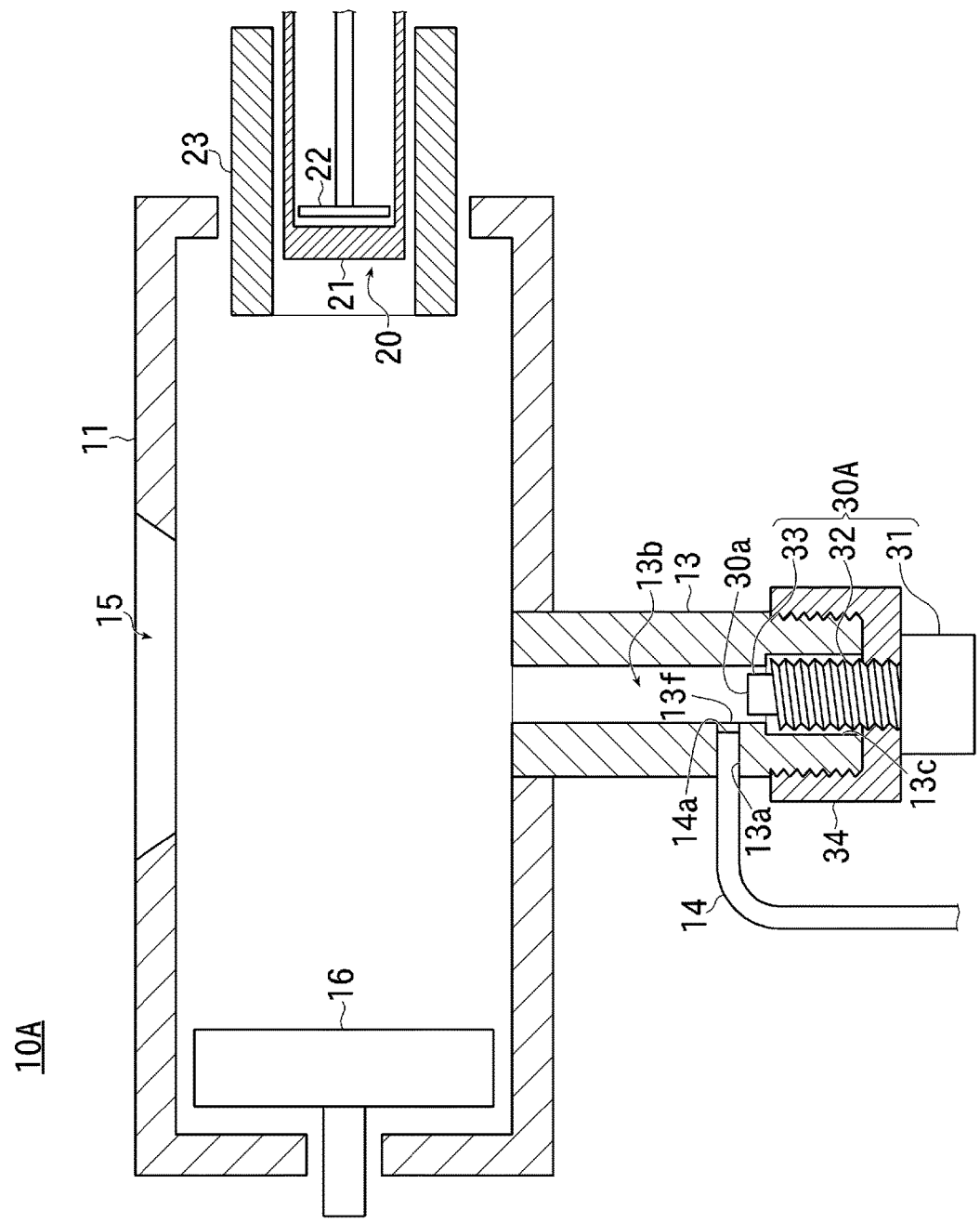
FIG. 5 is a configuration diagram illustrating another example of the cooling trap member.

FIG. 5 is a configuration diagram illustrating another example of the cooling trap member, and portions corresponding to those in the above embodiment will be denoted by the same reference numerals.

As illustrated in FIG. 5, a cooling trap member 30A of an ion source 10A of the present example includes the cooling trap portion 33 having a length shorter than its length illustrated in FIG. 3.

In addition, the size is determined such that, in the inner space 13b of the gas introduction pipe 13, the trap face 30a at the top of the cooling trap portion 33 is disposed on the side of direction away from the ion generation container 11 with respect to the supply-side leading end 14a of the gas supply pipe 14. Therefore, the cooling trap portion 33 of the present example is not provided at a position facing the supply-side leading end 14a of the gas supply pipe 14 in the inner space 13b of the gas introduction pipe 13.

Furthermore, in the present example, in the gas introduction port 13a of the gas introduction pipe 13, the supply-side leading end 14a of the gas supply pipe 14 is provided being positioned slightly inside with respect to an aperture end 13f of the gas introduction port 13a (in the example illustrated in FIG. 3, it is almost flush).

In the present example having such a configuration, the volume of the inner space 13b of the gas introduction pipe 13 is larger than that in the example illustrated in FIG. 3, and the abundance ratio (partial pressure) of the gaseous aluminum fluoride in the inner space 13b of the gas introduction pipe 13, particularly near the supply-side leading end 14a of the gas supply pipe 14 in the gas introduction port 13a is smaller than that in the example illustrated in FIG. 3.

Furthermore, in the present example, since the supply-side leading end 14a of the gas supply pipe 14 is positioned slightly inside with respect to the aperture end 13f of the gas introduction port 13a, the gaseous aluminum fluoride flowing into the inner space 13b of the gas introduction pipe 13 tends to adhere in a solid state to the trap face 30a at the top of the cooling trap portion 33 of the cooling trap member 30A, and hardly adheres to the supply-side leading end 14a of the gas supply pipe 14 and the interior wall face thereof.

According to the present example as described above, it is possible to prevent the gas supply pipe 14 from being clogged due to adhesion of the aluminum fluoride produced as a byproduct in the ion generation container 11 of the ion source 10A, in generation of aluminum ions, so that a stable ion beam current can be obtained. As a result, the maintenance cycle of the ion source 10A can be extended as compared with the conventional technique. In particular, in the present example, since the volume of the inner space 13b of the gas introduction pipe 13 is larger than that in the example illustrated in FIG. 3 and the partial pressure of the gaseous aluminum fluoride is much smaller, the maintenance cycle of the ion source 10A can be extended.

Figure 6:
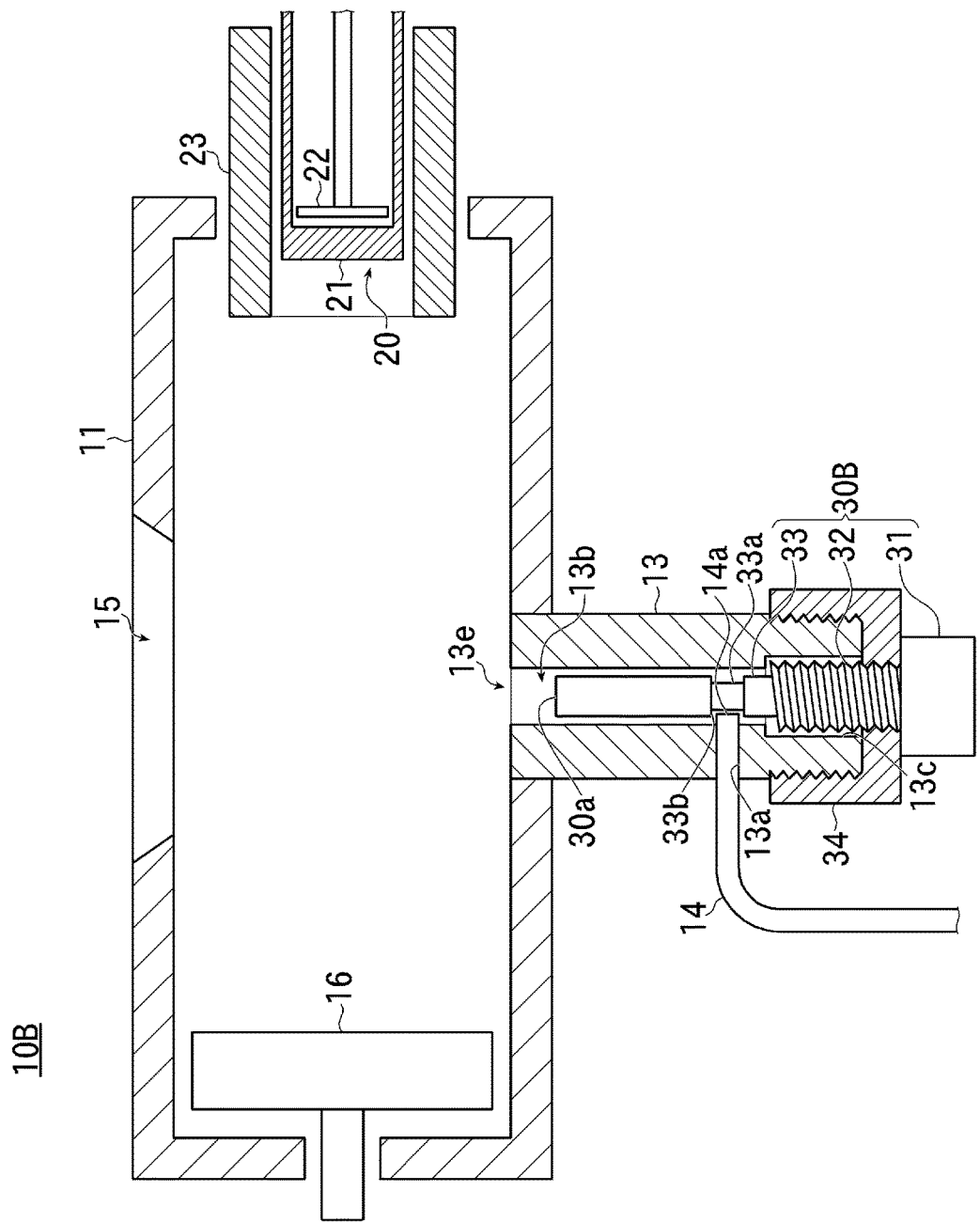
FIG. 6 is a configuration diagram illustrating still another example of the cooling trap member.

FIG. 6 is a configuration diagram illustrating still another example of the cooling trap member.

As illustrated in FIG. 6, a cooling trap member 30B of an ion source 10B of the present example includes the cooling trap portion 33 having a length longer than its length as illustrated in FIG. 3, and in a middle portion thereof, a retraction portion 33a is provided at a position facing the supply-side leading end 14a of the gas supply pipe 14 disposed in the gas introduction port 13a of the gas introduction pipe 13.

The retraction portion 33a is formed in a shape such as a cylinder or a rectangular column having an outer diameter smaller than that of another portion of the cooling trap portion 33. The retraction portion 33a is provided in a groove shape over the entire circumference of a column portion of the cooling trap portion 33 at a position facing the supply-side leading end 14a of the gas supply pipe 14. The groove of the retraction portion 33a is formed slightly wider than the width of the supply-side leading end 14a of the gas supply pipe 14, and the supply-side leading end 14a of the gas supply pipe 14 projected from the gas introduction port 13a to the inner space 13b of the gas introduction pipe 13 is disposed inside the groove of the retraction portion 33a, the supply-side leading end 14a coming close to the bottom of the groove.

In this case, the supply-side leading end 14a of the gas supply pipe 14 is preferably disposed at a position where the supply-side leading end 14a is hidden behind a side portion 33b on the ion generation container 11 side of the groove of the retraction portion 33a and is not directly viewed in a case of viewing from the aperture 13e side of the gas introduction pipe 13.

According to the present example as described above, the supply-side leading end 14a of the gas supply pipe 14 protruded from the gas introduction port 13a into the inner space 13b of the gas introduction pipe 13 is disposed being hidden behind the side portion 33b on the ion generation container 11 side of the groove of the retraction portion 33a. Consequently, in generation of aluminum ions in the ion generation container 11 of the ion source 10B, the amount of aluminum fluoride produced as a byproduct to adhere to the supply-side leading end 14a of the gas supply pipe 14 and the interior wall face thereof is reduced as much as possible. Thus, clogging of the gas supply pipe 14 can be reliably prevented and a stable ion beam current can be obtained.

Accordingly, the configurations of the ion generation container and the thermionic emitting portion are not limited to the above embodiment, and various configurations can be used.

REFERENCE SIGNS LIST

1 ION IMPLANTATION APPARATUS
10, 10A, 10B ION SOURCE
11 ION GENERATION CONTAINER
12 GAS SUPPLY UNIT
13 GAS INTRODUCTION PIPE
13a GAS INTRODUCTION PORT
13b INNER SPACE
13c HOUSING PORTION
13d THREADED PORTION
13e APERTURE
14 GAS SUPPLY PIPE
14a SUPPLY-SIDE LEADING END
20 THERMIONIC EMITTING PORTION
21 CATHODE PORTION
22 FILAMENT
23 ION SOURCE MATERIAL MEMBER
30, 30A, 30B COOLING TRAP MEMBER
31 KNOB
32 THREADED PORTION
33 COOLING TRAP PORTION
33a RETRACTION PORTION
34 ATTACHMENT MEMBER
34a, 34b THREADED PORTION

What is claimed is:

1. An ion source for generating an ion beam, the ion source comprising:
    an ion generation container configured to generate ions by reacting ionized gas introduced into the container via a tubular gas introduction pipe with an ion source material emitted in the container, the gas introduction pipe is configured to introduce the ionized gas into an inner space of the gas introduction pipe via a gas supply pipe; and
    a detachable cooling trap member provided in the inner space of the gas introduction pipe, the cooling trap member having a cooling trap portion that cools and traps a byproduct produced in the ion generation container, the cooling trap portion being disposed near a supply-side leading end of the gas supply pipe in the inner space of the gas introduction pipe and not in contact with an interior wall face of the gas introduction pipe.

2. The ion source according to claim 1, wherein the cooling trap portion of the cooling trap member includes a portion disposed on an ion generation container side with respect to the supply-side leading end of the gas supply pipe in the inner space of the gas introduction pipe.

3. The ion source according to claim 1, wherein the cooling trap portion of the cooling trap member is disposed on a distal side of the gas introduction pipe from the ion generation container with respect to the supply-side leading end of the gas supply pipe in the inner space of the gas introduction pipe.

4. The ion source according to claim 1, wherein the cooling trap member is detachably fixed by a screw, to a distal end of the gas introduction pipe from the ion generation container.

5. The ion source according to claim 1, wherein the cooling trap portion of the cooling trap member includes a planar trap face provided at a top of a rod-shaped portion.

6. The ion source according to claim 1, wherein:
    the cooling trap portion of the cooling trap member includes a groove-shaped retraction portion in a middle portion of a rod-shaped portion, and
    the supply-side leading end of the gas supply pipe projected into the inner space of the gas introduction pipe is disposed inside a groove of the retraction portion, the supply-side leading end being hidden behind a side portion on an ion generation container side of the groove.

7. The ion source according to claim 1, wherein the ionized gas is fluorine-based gas and the ions are aluminum ions obtained from aluminum nitride.

8. An ion implantation apparatus for implanting ions into a substrate with irradiation of an ion beam, the ion implantation apparatus comprising:
    an ion source, the ion source includes an ion generation container configured to generate ions by reacting ionized gas introduced into the container via a tubular gas introduction pipe with an ion source material emitted in the container, the gas introduction pipe is configured to introduce the ionized gas into an inner space of the gas introduction pipe via a gas supply pipe; and
    a detachable cooling trap member provided in the inner space of the gas introduction pipe, the cooling trap member having a cooling trap portion that cools and traps a byproduct produced in the ion generation container, the cooling trap portion being disposed near a supply-side leading end of the gas supply pipe in the inner space of the gas introduction pipe and not in contact with an interior wall face of the gas introduction pipe, wherein:
    the substrate is configured to be irradiated with the ion beam emitted from the ion source such that the ions are implanted into the substrate.

* * * * *